(12) United States Patent
Caird

(10) Patent No.: US 8,143,879 B2
(45) Date of Patent: Mar. 27, 2012

(54) METER PHASE IDENTIFICATION

(75) Inventor: Kenneth J. Caird, Smyrna, GA (US)

(73) Assignee: General Electric Company, Schenectady, NY (US)

( * ) Notice: Subject to any disclaimer, the term of this patent is extended or adjusted under 35 U.S.C. 154(b) by 390 days.

(21) Appl. No.: 12/345,702

(22) Filed: Dec. 30, 2008

(65) Prior Publication Data

US 2010/0164473 A1 Jul. 1, 2010

(51) Int. Cl.
*G01R 19/00* (2006.01)
(52) U.S. Cl. ............ 324/66; 324/76.11; 324/76.52
(58) Field of Classification Search .......... None
See application file for complete search history.

(56) References Cited

U.S. PATENT DOCUMENTS

| | | | |
|---|---|---|---|
| 4,852,174 A | 7/1989 | Bouchard | |
| 5,125,738 A * | 6/1992 | Kawamura et al. | 356/44 |
| 5,467,011 A | 11/1995 | Hunt | |
| 5,510,700 A | 4/1996 | Pomatto | |
| 7,200,223 B2 * | 4/2007 | Fortier | 379/416 |
| 7,372,246 B2 | 5/2008 | Marsden et al. | |
| 2003/0158677 A1 | 8/2003 | Swarztrauber et al. | |
| 2004/0000898 A1 | 1/2004 | Pool et al. | |
| 2004/0263147 A1 | 12/2004 | Piesinger | |
| 2007/0296396 A1 | 12/2007 | Nakahira | |
| 2008/0116877 A1 | 5/2008 | Giubbini et al. | |
| 2008/0143321 A1 * | 6/2008 | Carkner | 324/119 |
| 2008/0219292 A1 * | 9/2008 | Wang | 370/484 |
| 2010/0060259 A1 | 3/2010 | Vaswani et al. | |
| 2010/0134089 A1 | 6/2010 | Uram et al. | |

FOREIGN PATENT DOCUMENTS

| | | |
|---|---|---|
| DE | 29715826 U1 | 2/1998 |
| GB | 2267971 | 12/1993 |
| WO | 9500991 A1 | 1/1995 |
| WO | 2005116668 A1 | 12/2005 |
| WO | 2006018031 A1 | 2/2006 |

* cited by examiner

*Primary Examiner* — Melissa Koval
*Assistant Examiner* — Trung Nguyen
(74) *Attorney, Agent, or Firm* — William F. Heinze; Ernest G. Cusick; Frank A. Landgraff

(57) ABSTRACT

A multi-phase electrical power distribution network includes a substation; a signal generator for providing a different signal on each of a plurality of phases leaving the substation; and a signal discriminator for detecting each of the different signals at a consumer of the electrical power.

17 Claims, 2 Drawing Sheets

METER PHASE IDENTIFICATION

BACKGROUND OF THE INVENTION

1. Technical Field

The subject matter described here generally relates to electricity measuring and testing, and, more particularly, to conductor identification or location including phase identification.

2. Related Art

As illustrated in FIG. 1, electric power distribution networks 2 are used by the electric utilities to deliver electricity from generating plants 4 to end-users, such as consumers or customers 6. Although the actual distribution voltages will vary from utility to utility, in the non-limiting example illustrated here, three-phase power from a generating plant 4 is fed to a generator step up transformer 8 which provides 765 V to 138 kV power to transmission lines 10. High voltage power from the transmission lines 10 is delivered to various substations 12 at which other transformers 8 step this voltage down to lower three-phase voltages and ultimately separate the power into three single-phase feeder lines 14. Each of these feeder lines 14 then branch into multiple circuits to power a plurality of local pole-mounted or pad-mounted transformers 8 which step the voltage down to final voltages of 120 and 240 volts for delivery and metering at commercial and residential customer locations 6.

So called "smart meters" 16 monitor the electrical consumption by consumers 6 in detail and then communicate that information back to the utility in a process referred to as "telemetering." For example, the General Electric Company offers a family of "kV2c" meters and accessories. Various telemetering networks have been proposed for these and other electrical smart meters 16, including cell/pager networks, licensed and unlicensed radio networks, and power line communication networks. For the power line telemetering network illustrated in FIG. 1, it is important to know which phase the smart meter is connected and that this information is transmittable through the transformers 8.

Ideally, the feeder circuits 14 are designed such that the loads on each single-phase output of any three-phase transformer 8 are equal. However, as new customers are added over time, any one of the phases may become more heavily loaded than the others. In order to re-balance that loading, some of the branch circuits 14 may then be switched from the more heavily loaded phase to the more lightly loaded phases.

Consequently, the records telling a smart meter 16 installer which phase an individual customer 6 is on are incomplete or inaccurate. Therefore, in order to accurately identify the current phase of a particular feeder branch, utility company personnel must physically trace a cable run back through various distribution facilities until they reach a point in the distribution network 2 at which the phase is definitively known. This can be a very time-consuming and labor intensive process which can often lead to incorrect information. During storms or emergencies this can also lead to safety issues as well.

BRIEF DESCRIPTION OF THE INVENTION

These and other drawbacks associated with such conventional approaches are addressed here in by providing, in various embodiments, a multi-phase electrical power distribution network including a substation; a signal generator for providing a different signal on each of a plurality of phases leaving the substation; and a signal discriminator for detecting each of the different signals at a consumer of the electrical power.

BRIEF DESCRIPTION OF THE DRAWINGS

Various aspects of this technology will now be described with reference to the following figures ("FIGs.") which are not necessarily drawn to scale, but use the same reference numerals to designate corresponding parts throughout each of the several views.

DETAILED DESCRIPTION OF THE INVENTION

Figure 1:
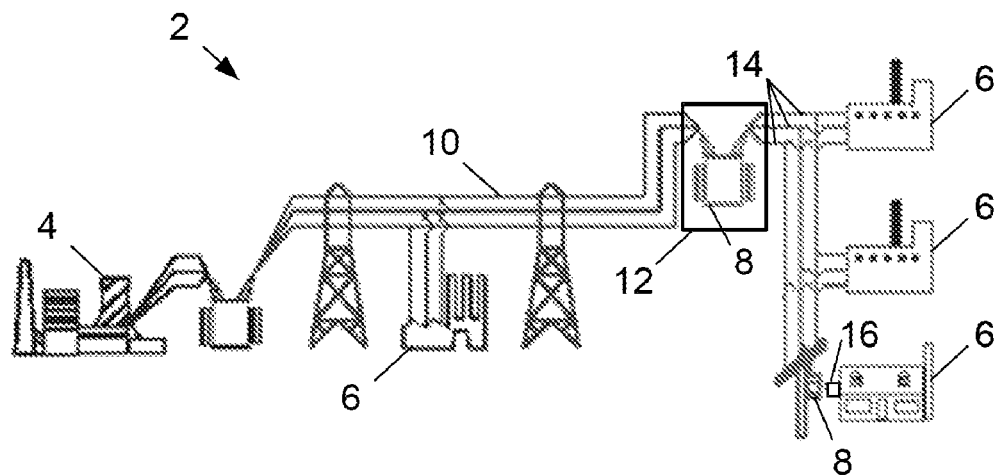
FIG. 1 is a schematic view of an electrical distribution network.
Figure 2:
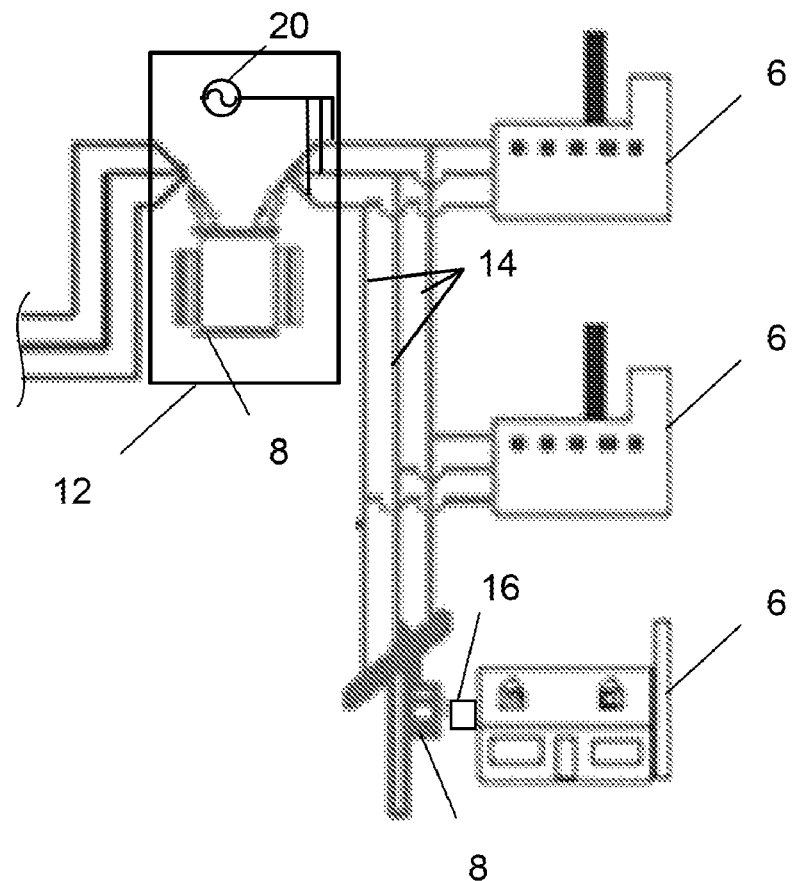
FIG. 2 is a partial schematic view of an electrical distribution network.

FIG. 2 illustrates multi-phase electrical power distribution network 2 including a substation 12, a signal generator 20 for providing a different signal on each of a plurality of phases leaving the substation 12. The signal generator 20 may be used with any power distribution network 2, including, but not limited to the network shown in FIG. 1. Although the signal generator 20 is illustrated as being arranged in the substation 12, the signal generator 20 may also be arranged at any location in the network 2 and/or may provide the signals at other points in the network such as at the generating plant 4 or transmission lines 10. The signals may also be provided on less than all of the phases and/or at different locations for any of the phases. Separate signal generators 20 may also be provided for each phase.

The signal generator(s) 20 provided signals which are capable of being distinguished from the typical 60 Hz or 50 Hz power signal provided on the power distribution network 2. For example, the signals from the signal generator(s) may have a digital and/or analog frequency of more or less than the 50-60 Hz power frequency. Since low frequency signals can travel through the transformers 8 with less attenuation, the signals from the signal generator(s) 16 may have one or more frequency components less than about 60 Hz, less than about 50 Hz, less than about 30 Hz, less than about 25 Hz, and/or less than about 10 Hz. For example, the signal from the signal generator 20 may include an A/C signal having a frequency or frequency component of between less than 1 Hz and 60 Hz. Other information about the network 2 and/or consumer 6 may also carried by the signal from the signal generator 20.

Figure 3:
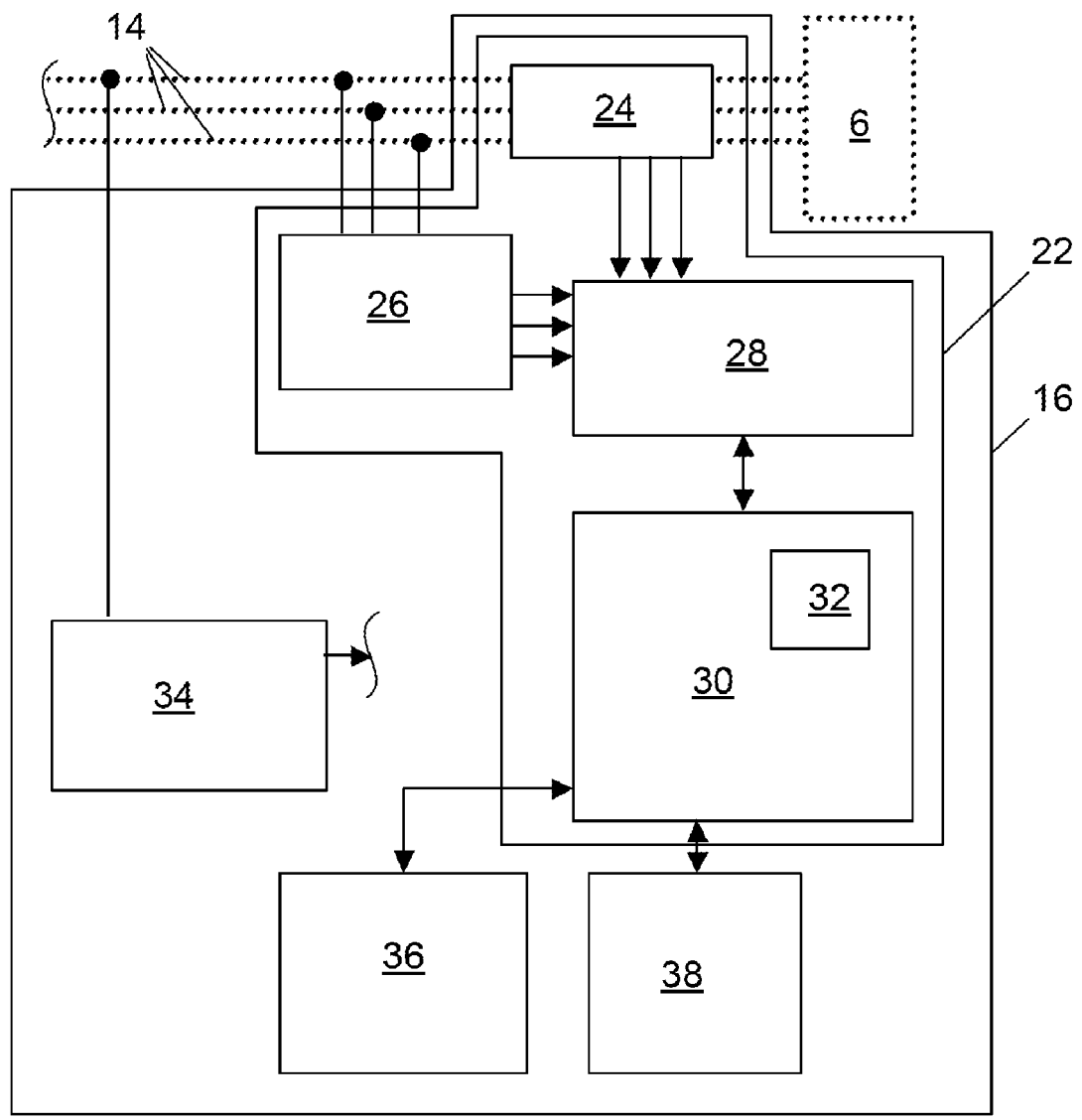
FIG. 3 is a schematic view of a smart meter for use with the electrical distribution network shown in FIG. 2.

A signal discriminator 22 detects each of the different signals from the signal generator 20. For example, as illustrated in FIG. 3, the smart meter 16 may be arranged to include a signal discriminator 22 having a variety of components, including but not limited to one or more current sensors 24, voltage sensors 26, digital/analog processor 28, microprocessor or microcomputer 30. For example, the digital/analog processor 28 may include a multi-channel analog to digital converter, and the microcomputer 30 may include a 32 bit, 32 MHz processor with 2 Mbit of ROM, 64 kBit RAM, and waveform capture. The signal discriminator 22 may also include a filter 32. Although the signal discriminator 22 illustrated here is implemented in digital electronic form, any or all of the components of the smart meter 16 may be implemented with software, hardware, and/or firmware in analog and/or digital form.

The signal discriminator 22 and/or other components of the smart meter 16 may also be arranged at other points in the distribution network 2 such as at any of the transformers 8. In the illustrated example, the signal discriminator 22 receives input from the feeder line(s) 14 and passes that input through the digital filter 32. However, the filter 32 may be implemented as a notch filter or a low-pass filter. The filter 32 may also be implemented in analog form.

Various other components of the smart meter 16 may support the operation of the signal discriminator 22 such as the power supply 34, flash memory 36 and/or EEPROM 38. For example, the power supply 34 may be a 120V-480V source of direct current for various other components, the flash memory 36 may include 4 Mbit with event log, load profile and self-read data, and the EEPROM may include 64 bits for storing data and program parameters. Other types of digital and/or analog memory may also be used.

The technology described above offers various advantages over conventional approaches. For example, it allows utilities and consumers 6 to accurately identify the current phase to which a smart meter 16 and/or other electrical device is connected without having to physically trace a cable run back through various distribution facilities. The technology also provides a simple and effective way for various devices to confirm that they are connected to the same phase.

It should be emphasized that the embodiments described above, and particularly any "preferred" embodiments, are merely examples of various implementations that have been set forth here to provide a clear understanding of various aspects of this technology. One of ordinary skill will be able to alter many of these embodiments without substantially departing from scope of protection defined solely by the proper construction of the following claims.

What is claimed is:

1. A multi-phase electrical power distribution network, comprising:
    a substation;
    a signal generator for providing signals at different frequencies on each of a plurality of phases leaving the substation, wherein each of the plurality of phases operates at a frequency that is different from the signal generator frequencies; and
    a signal discriminator for detecting each of the provided signals at a consumer of the electrical power.

2. The network recited in claim 1, further comprising a meter including the signal discriminator.

3. The network recited in claim 1, wherein each of the signals comprises a different alternating signal.

4. The network recited in claim 3, wherein each of the alternating signals comprises a frequency less than about 60 Hz.

5. The network recited in claim 4, wherein the signal discriminator comprises a digital filter.

6. The network recited in claim 5, further comprising a meter including the signal discriminator.

7. The network recited in claim 3, wherein each of the alternating signals comprises a frequency less than about 50 Hz.

8. The network recited in claim 3, wherein each of the alternating signals comprises a frequency less than about 25 Hz.

9. The network recited in claim 3, wherein each of the alternating signals comprises a frequency less than about 10 Hz.

10. An electrical smart meter comprising a signal discriminator for receiving a power signal from a substation having a first frequency and determining a phase to which the meter is connected, wherein the phase operates at a second frequency that is different from the first frequency.

11. The electrical smart meter recited in claim 10, wherein the signal comprises an alternating signal.

12. The electrical smart meter recited in claim 11, wherein the signal discriminator comprises at least one filter.

13. The electrical smart meter recited in claim 12, wherein the alternating signal comprises a frequency of less than 60 Hz.

14. A method of meter phase identification, comprising:
    generating signals at different frequencies on each of a plurality of phases from a substation;
    receiving one of the signals at a consumer meter; and
    discriminating the received signal for determining to which of the plurality of phases the meter is connected.

15. The method recited in claim 14, wherein each of the signals comprises and alternating signal.

16. The method recited in claim 15, wherein each of the alternating signal comprises a frequency less than 60 Hz.

17. The method recited in claim 16, wherein the discriminating step further comprises filtering the signal.

* * * * *